United States Patent [19]
Niot

[11] Patent Number: 5,831,556
[45] Date of Patent: Nov. 3, 1998

[54] PIN-REDUCED LOW POWER KEYBOARD SCANNER

[75] Inventor: Francois Niot, Biot, France

[73] Assignee: VLSI Technology, Inc., San Jose, Calif.

[21] Appl. No.: 870,167

[22] Filed: Jun. 6, 1997

[51] Int. Cl.[6] .......................... H03K 17/94; H03M 11/00
[52] U.S. Cl. .................. 341/26; 341/22; 364/709.12; 345/168; 400/477
[58] Field of Search .................... 341/20, 22, 26; 400/477, 479, 479.1; 364/189, 709.01, 709.12; 345/168, 174

[56] References Cited

U.S. PATENT DOCUMENTS

| | | |
|---|---|---|
| 4,333,089 | 6/1982 | Leininger . |
| 4,701,748 | 10/1987 | Ushiki et al. . |
| 4,728,932 | 3/1988 | Atherton . |
| 4,906,993 | 3/1990 | Freeman et al. ........................ 341/22 |
| 4,918,445 | 4/1990 | Bower . |
| 5,151,554 | 9/1992 | Matsuda . |
| 5,424,731 | 6/1995 | Kronberg . |
| 5,430,443 | 7/1995 | Mitchell . |
| 5,450,080 | 9/1995 | Irwin ........................................ 341/22 |
| 5,534,860 | 7/1996 | Phillips et al. ........................... 341/22 |
| 5,667,687 | 9/1997 | Valdenaire . |
| 5,677,687 | 10/1997 | Valdenaire ............................... 341/22 |

OTHER PUBLICATIONS

P. H. Buffard, "Key Coding Arrangement," *IBM Technical Disclosure Bulletin*, vol. 21, No. 11, Apr. 1979, pp. 4548–4549.

*Primary Examiner*—Michael Horabik
*Assistant Examiner*—Timothy Edwards, Jr.
*Attorney, Agent, or Firm*—Merchant, Gould, Smith, Edell, Welter & Schmidt, P.A.

[57] ABSTRACT

An arrangement for providing key switch actuation detection which reduces the number of key switch inputs required at a key switch controller. A key scanning system for detecting the activation of keys on a key-based input device is provided, having a plurality of logic level sensors to detect and temporarily store logic levels on corresponding connection nodes. A plurality of switches, each coupled to one of the keys, provides a pattern of logic levels on the connection nodes in response to the activation of a particular key. A logic monitor is coupled to the logic level sensors to detect the stored logic levels and recognize the activation of the particular key based on the pattern of the stored logic levels. A method for performing key switch actuation detection that reduces the number of required key switch inputs is also provided.

26 Claims, 4 Drawing Sheets

PIN-REDUCED LOW POWER KEYBOARD SCANNER

FIELD OF THE INVENTION

The present invention relates generally to keyboard and keypad user interfaces. More particularly, this invention relates to a system and method for providing single-dimension key switch detection which reduces the number of key switch inputs required at a key switch controller.

BACKGROUND OF THE INVENTION

Generally, keyboards and keypads are devices that provide a user-interface to an electrical or electronic system. A keyboard or keypad typically includes switches connected to each key of the keyboard which are used to indicate that a particular key corresponding to the switch has been pressed. Keypads and keyboards are often used in electronic devices such as calculators, and as user-interface devices to computers. An interface establishes a communication path between the key-based input devices and these computing devices, wherein the transmission across the interface of information traffic must be properly recognized and policed.

Prior art keyboard scanners include devices which detect whether a key is active, and also which key is active. One approach to detecting activated keys is via a linear array of keyboard switches which are monitored by repeatedly scanning individual switches. Such a configuration requires a separate connection for each key, resulting in a circuit and interface which is undesirably large, cumbersome, and expensive.

Matrix keypads consist of multiple keys or other switching devices coupled to the intersections of two parallel groups of conductors representing rows and columns. Activation of a key in a matrix configuration results in a change of logic state on both intersecting row and column connectors which are coupled to the activated switch. A keyboard controller scans the rows and columns to determine which row and which column is associated with the modified logic state. The switch corresponding to that intersection is then recognized as the activated key.

This matrix configuration requires fewer input pins to interface to the keyboard than that of the linear array. For example, the linear keyboard arrangement described above would require a number of input pins equal to the number of keys that can be activated on the keyboard. However, the number of input pins required for the matrix configuration can be reduced to a number equal to the sum of two multiples of the total number of keys represented in the matrix. For instance, 24 keys could be represented by 4 rows and 6 columns, thereby requiring 10 input pins. Alternatively, the matrix could be arranged such that there were 5 rows and 5 columns, which still require 10 input pins.

The matrix configuration of the prior art, however, still requires more input pins than are necessary for a particular number of keys. Because the matrix arrangement requires that 2 connectors be shorted together to produce one unique key activation indication, not all possible combinations are utilized. The matrix configuration requires a relationship between a particular row connector and column connector. Therefore, connector combinations including only row conductors or only column conductors are prohibited. This reduces the number of possible keys which can be represented on a particular number of conductors. For example, a matrix configuration having 4 keys could be arranged as having 2 row conductors intersecting with 2 column conductors. This provides 4 intersections between rows and columns which can be coupled to key switches. Because there is no relationship between row conductors themselves, or between column conductors themselves, these pin combinations are lost. Therefore, valuable pin resources are wasted, which can result in lost utilization of the computing device, as well as increased cost.

Accordingly, there is a need for a system and method for providing a reduced-pin keyboard interface which consumes relatively low power and allows a given number of keys to be recognized using a lower number of input pins. The present invention provides a solution to the aforementioned problems, and offers other advantages over the prior art.

SUMMARY OF THE INVENTION

The present invention is directed to a system and method for providing key switch actuation detection which reduces the number of key switch inputs required at a key switch controller.

In accordance with one embodiment of the invention, a key scanning system for detecting the activation of keys on a key-based input device is provided. A plurality of logic level sensors detect and temporarily store logic levels on corresponding connection nodes. A plurality of switches, each coupled to one of the keys, provides a pattern of logic levels on the connection nodes in response to the activation of a particular key. A logic monitor is coupled to the logic level sensors to detect the stored logic levels and recognize the activation of the particular key based on the pattern of the stored logic levels.

In accordance with another embodiment of the invention, a method for detecting the actuation of switches in a key-based input device is provided. The method includes imparting a unique pattern of logic levels onto a plurality of nodes upon actuation of one of the switches. The unique pattern of logic levels on the plurality of nodes is temporarily stored, and the nodes are periodically monitored. The stored logic levels are compared to a plurality of known binary patterns to determine which of the switches has been actuated by matching the patterns of stored logic levels to one of the known binary patterns.

In a more specific embodiment of the invention, an activated-key detecting arrangement is provided for use with a keyboard/keypad control circuit. The arrangement includes Y send-return lines, where each of N keys is assigned to at least two send-return lines. A set of Y level-maintaining circuits is also provided, where each of the level-maintaining circuits is assigned and coupled to a send-return line and arranged to maintain a logic level on the assigned send-return line. N switches are coupled to at least two send-return lines. A control circuit is coupled to the Y send-return lines, and is configured to drive a first logic level onto one of the Y send-return lines, drive a second logic level onto the remaining (Y−1) of the Y send-return lines, and detect a logic state imparted on the one of the Y send-return lines by driving the second logic level from one of the remaining (Y−1) send-return lines onto the Y send-return line, where any of the N keys corresponding to the remaining (Y−1) send-return lines had been activated. The control circuit repeats the first logic level driving, maintaining, second logic level driving and detecting steps while driving the first logic level on a different one of the Y send-return lines during each iteration. It is then determined which of the N keys has been activated, as it is a function of the detected logic states, and of a table which maps the detected logic states to one or more keys.

In yet another specific embodiment of the invention, a method for detecting an activated one of N keys in connection with a keyboard/keypad control circuit is provided. A first logic level is stored on one of Y connection lines, where each of the N keys is assigned and coupled to at least two connection lines. A level-maintaining circuit is used to maintain the first logic level on the particular one of the Y connection lines, and a second logic level is stored on the remaining (Y−1) of the Y connection lines. A logic state stored on one of the Y connection lines is detected as a result of imparting the second logic level from one of the remaining (Y−1) connection lines to the Y connection lines when any of the N keys corresponding to the remaining connection lines has been activated. The first logic level storing, maintaining, second logic level storing, and detecting steps are repeated, while storing the first logic level on a different one of the Y connection lines during each iteration. Finally, it is determined which of the N keys has been activated as a function of the detected logic states and of a table mapping the detected logic states to one or more keys.

The above summary of the present invention is not intended to describe each illustrated embodiment or implementation of the present invention. This is the purpose of the figures and the associated discussion which follows.

BRIEF DESCRIPTION OF THE DRAWINGS

Other aspects and advantages of the present invention will become apparent upon reading the following detailed description and upon reference to the drawings in which.

Figure 1:
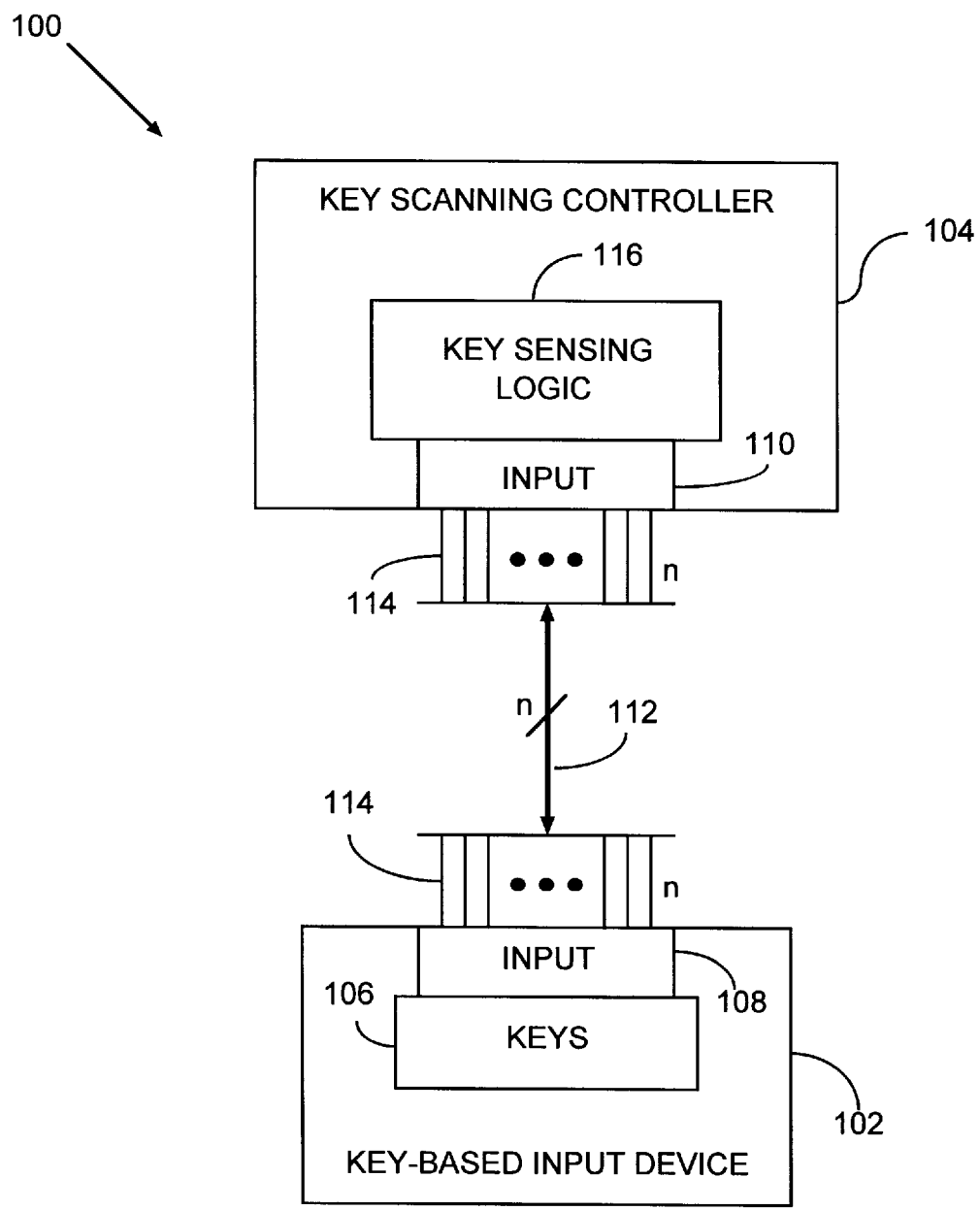
FIG. 1 is a block diagram of a keyboard or keypad arrangement in accordance with one embodiment of the invention.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE ILLUSTRATED EMBODIMENTS

The present invention is believed to have application in systems utilizing user-interfaces including a variety of different types of keyboard and keypad entry mechanisms. The present invention has been found to be particularly helpful for computer keyboards and electronic devices having keypads, such as calculators. While the present invention may have many more uses, it is in this context that the present invention is discussed.

Referring now to FIG. 1, a block diagram of a keyboard or keypad arrangement 100 in accordance with one embodiment of the invention is provided. FIG. 1 illustrates the interface between a key-based input device 102 and key scanning controller 104. The key-based input device 102 includes peripheral devices such as computer keyboards and keypads for calculators or other electrical/electronic devices. Multiple keys 106 of the key-based input device 102 provide a mechanism for which users can interface to a computing device through the key scanning controller 104. The keys 106 are typically physical pads which activate a corresponding switch upon being pressed. An input terminal 108 provides the switch signals to the key scanning controller 104 via input 110.

The key scanning controller 104 refers generally to the mechanism by which the signals received at input 110 are accepted, sensed, monitored, and the like. The key scanning controller 104 may be separate from, or integrated with, a computing system to which the key-based input device 102 is coupled. Where it is integrated with the computing system, the key scanning controller 104 will typically be configured as an operable portion of a central processing unit or microprocessor, microcontroller, or other computing device.

The number of pins required at the input 110 of the key scanning controller 104 depends on the number of keys 106, and the number of interface connections n on the interface 112. It is desirable to minimize the number of connections 114 on the interface 112 in order to save input pin capacity at the key scanning controller 104. The key sensing logic 116 of the present invention, and its implementation within the key scanning controller 104, allow the number n of connections 114 on interface 112 to be minimized.

Figure 2:
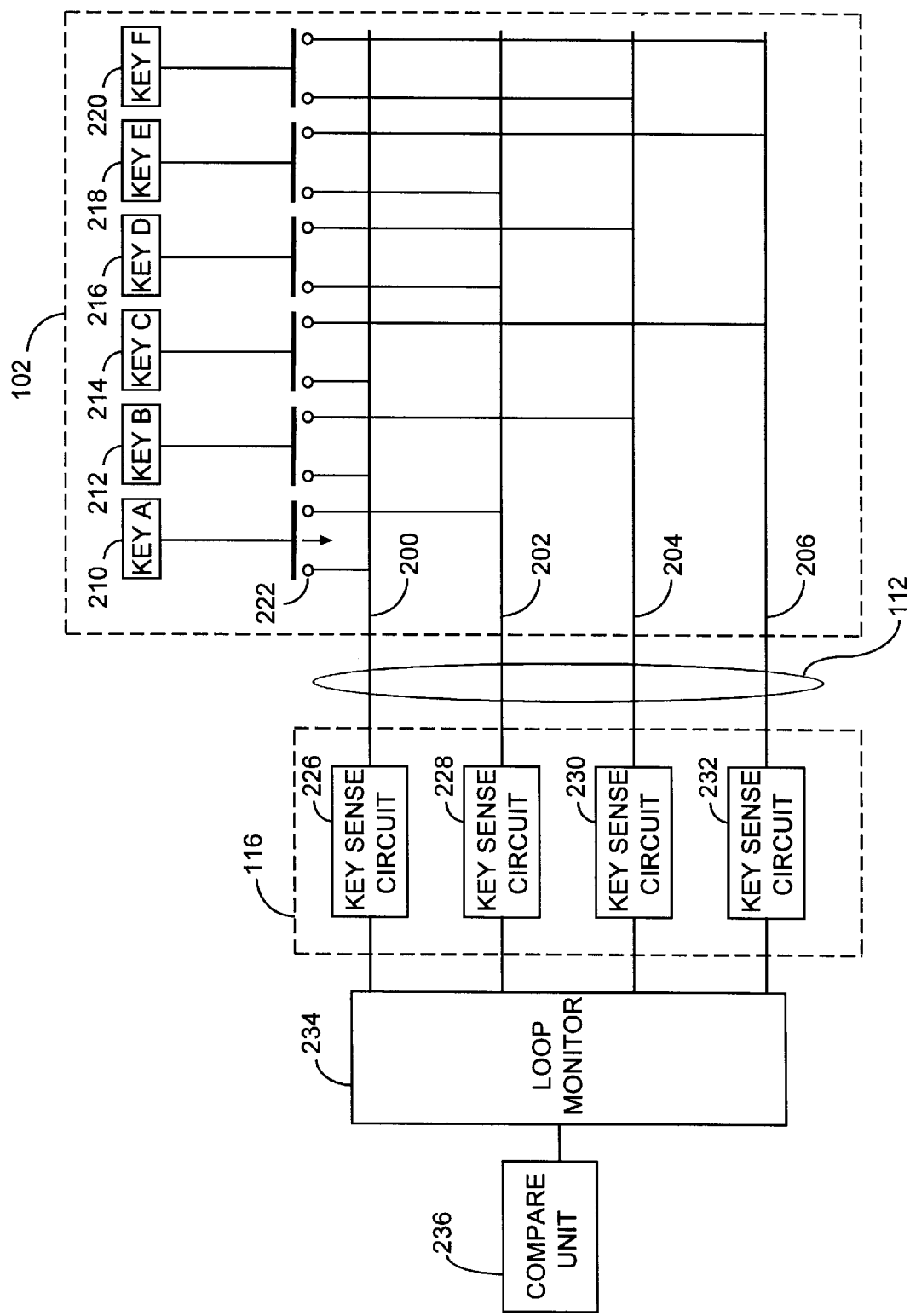
FIG. 2 is a block diagram illustrating the interface between a key-based input device and a key scanning controller in accordance with an embodiment of the invention.

FIG. 2 is a block diagram illustrating the interface between the key-based input device 102 and a key scanning controller, such as key scanning controller 104, in accordance with one embodiment of the invention. The example of FIG. 2 is illustrated such that n=4 on interface 112, thereby having 4 connections 114. However, it should be understood that the principle described in connection with FIG. 2 can be expanded to include any number of interface 112 connections 114 without departing from the scope and spirit of the invention. The number n of connections 114 required is dependent on the number of keys 106 utilized, as will be seen in the following description.

The example of FIG. 2 includes four connections 200, 202, 204 and 206 which together comprise interface 112. The key sensing logic 116 and its implementation within a key scanning controller such as key scanning controller 104 allow a maximum number of keys to be recognized using the connection lines of interface 112. The number of connection lines on interface 112 which are required to accommodate the desired number of keys in accordance with the present invention can be determined by calculating the number of combinations of n different things, taken k at a time, without repetitions, as shown in Eq. 1 below:

$$\#\text{keys} = \binom{n}{k} = \frac{n!}{k!\,(n-k)!} \qquad [\text{Eq. 1}]$$

where:

n is the number of connections, and k is the number of connections affected by a pressed key In the example of FIG. 2, four connections are available, and two connections are coupled together as a result of a pressed key. For the example of FIG. 2, this results in the ability to provide for the employment of six keys where only four connections are available, as shown in Eq. 2 below:

$$\#\text{keys} = \binom{4}{2} = \frac{4!}{2!(4-2)!} = \frac{24}{2(2)} = 6 \quad \text{[Eq. 2]}$$

The six keys available using four connections 200, 202, 204 and 206 are shown in FIG. 2 as key A 210, key B 212, key C 214, key D 216, key E 218 and key F 220. Eq. 2 indicates that two connections are affected by actuation of any particular key, and each of the keys 210–220 are therefore connected to two different connections. Key A 210, for example, causes both connection 200 and connection 202 to be coupled together to provide a common logic level, e.g., a low logic level, when key A 210 is pressed. This is caused by activation of switch 222, which couples connections 200 and 202 when key A 210 is pressed.

In one embodiment of the invention, each connection is individually monitored for a predetermined length of time by the key sensing logic 116. For example, connection 200 will be initialized to a first logic level, such as a high logic level, and activation of key A 210 will cause connection 200 to drop to a low logic level as a result of connection 202 having been driven to a low logic level. The low logic level of connection 202 overrides the initialized high logic level at connection 200. This process will be described in greater detail in connection with FIGS. 3, 4 and 5.

In a manner similar to the description of key A 210 above, key B 212, key C 214, key D 216, key E 218 and key F 220 are coupled to concurrently cause two connections to be coupled together at a low logic level upon actuation of the respective key. The interface of keys 210–220 to connections 200, 202, 204 and 206 is shown in Table 1 below:

TABLE 1

|  | CONNECTOR 200 | CONNECTOR 202 | CONNECTOR 204 | CONNECTOR 206 |
| --- | --- | --- | --- | --- |
| KEY A | X | X |  |  |
| KEY B | X |  | X |  |
| KEY C | X |  |  | X |
| KEY D |  | X | X |  |
| KEY E |  | X |  | X |
| KEY F |  |  | X | X |

As shown in Table 1, key A 210 is coupled to two connections 200 and 202, which correspond to two input pins at the key scanning controller 104. Key B 212 is coupled to connections 200 and 204, key C 214 is coupled to connections 200 and 206, key D 216 is coupled to connections 202 and 204, key E 218 is coupled to connections 202 and 206, and key F 220 is coupled to connections 204 and 206. As will become readily apparent to those skilled in the art, the number "k" of connections concurrently switched to a particular logic level can be increased from two to a larger value, and the response by the key scanning controller 104 modified accordingly.

The connections 200–206 are generally associated with input pins to the key scanning controller 104, as each connection requires an input pin at the input 110 of the key scanning controller 104 or other key scanning device. Consequently, reducing the number of connections on the interface 112 necessarily reduces the number of input pins required at the key scanning controller 104.

When any particular key 210–220 is activated through pressing the key, its two corresponding connections are thereby coupled together resulting in a common logic level between the corresponding connections. The key sense circuits 226, 228, 230 and 232 detect the voltage change on their respective connections 200, 202, 204 and 206 when any of the keys 210–220 coupled to the connection is pressed. Each key sense circuit will detect actuation of any one of three keys in the illustrated embodiment. For example, key sense circuit 226 will detect that key A 210, key B 212 or key C 214 is pressed, because actuation of any keys 210–214 causes the connection 200 to be switched from a first logic level, such as a high logic level, to a second logic level such as a low logic level. Therefore, in order to determine which particular one of the keys A 210, B 212, or C 214 was pressed, connections 202, 204 and 206 must also be monitored. For example, where the key sense circuit 230 also sensed a low logic level, it would become evident that key B 212 was activated, because connections 200 and 204 had been switched to low logic levels during their monitored periods.

The key sense circuits 226–232 allow a smaller number of connections to be used to identify a particular number of keys 210–220 by storing logic levels present on the connections 200–206, and associating the various logic combinations to particular keys. Each of the key sense circuits 226–232 are monitored by the loop monitor 234, which reads the logic level stored by the key sense circuits 226–232. The particular pattern recognized by the loop monitor 234 is then compared to known values in order to determine which of the keys 210–220 has been pressed.

The loop monitor 234 allows each of the key sense circuits 226, 228, 230 and 232 to be monitored in order to identify the logic levels stored at each of the key sense circuits. In one embodiment of the invention, the loop monitor is implemented using a processing unit controlled by software which directs the processing unit to periodically read the stored logic levels. This can be implemented using a software looping routine, where the monitoring interval is programmable. In one embodiment, the loop monitor 234 is configured from using hardware. As will be appreciated by those skilled in the art, such a hardware loop monitor may include circuitry to periodically monitor each of the connections 200–206, such as a selection or multiplexing unit having a control signal configured to analyze each connection in a repeated, looping fashion. The information identified by the loop monitor 234 can be stored in various types of memory structures, including random access memory (RAM).

The compare function block 236 conceptually illustrates that the identified logic level information from the loop monitor 234 is compared to known information to determine which of the keys has been activated. The comparing of the logic level information to the known information can be accomplished using hardware and/or software. For example, in one embodiment of the invention, the software which monitors for a pressed key compares the value which is output by the loop monitor 234 to a value corresponding to a key that has been pressed. In such an embodiment, the comparison function may be performed by the application software which monitors for pressed keys, and is therefore not part of the keyboard controller hardware.

The compare function can be appreciated by an example in which the loop monitor 234 identifies a low logic value on connector 200 and 206, and the 4 inputs to the loop monitor 234 appear as binary 0110. In one embodiment, this value is compared to a table of binary pattern possibilities. Such a table is shown in Table 2 below:

TABLE 2

| CONNEC-TION 200 | CONNEC-TION 202 | CONNEC-TION 204 | CONNEC-TION 206 | IDENTIFIED KEY |
|---|---|---|---|---|
| 0 | 0 | 1 | 1 | KEY A 210 |
| 0 | 1 | 0 | 1 | KEY B 212 |
| 0 | 1 | 1 | 0 | KEY C 214 |
| 1 | 0 | 0 | 1 | KEY D 216 |
| 1 | 0 | 1 | 0 | KEY E 218 |
| 1 | 1 | 0 | 0 | KEY F 220 |

In another embodiment of the invention, the information obtained at the loop monitor is directly sensed by hardware which is configured to identify the particular key selected.

Figure 3:
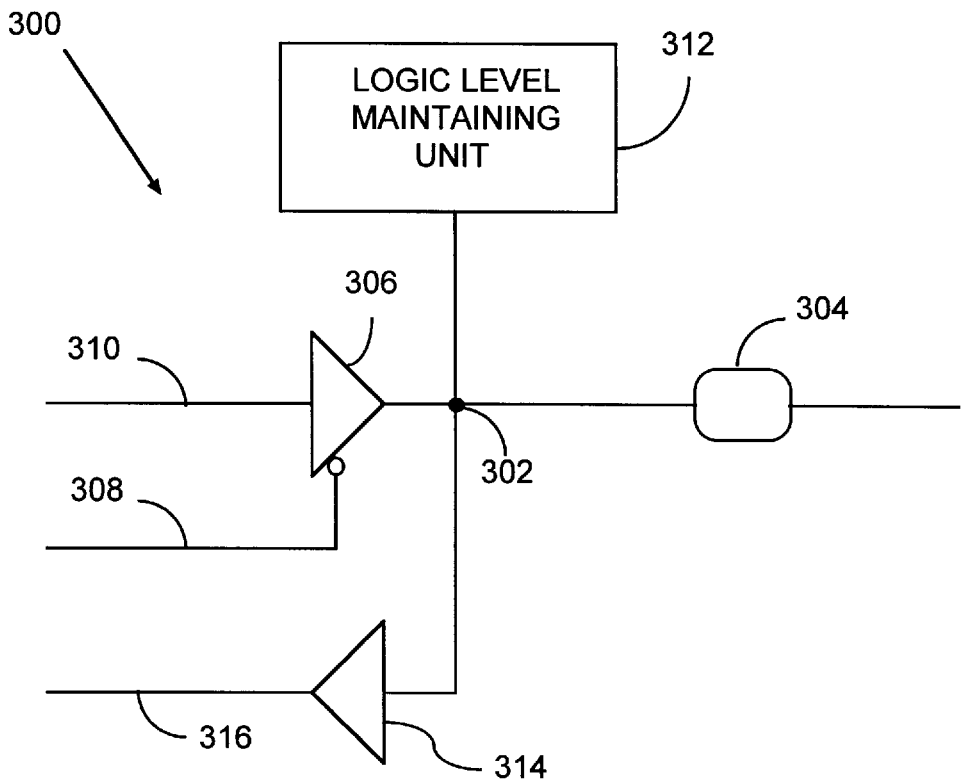
FIG. 3 illustrates one embodiment of a key sense circuit which is particularly suited for use in the present invention.

FIG. 3 illustrates one embodiment of a key sense circuit 300 which is particularly suited for use in the present invention. The key sense circuit 300 is a bi-directional input/output (I/O) device. The node 302 is accessible to provide for bi-directional signal flow between the key sense circuit 300 and a key-based input device, such as key-based input device 102 of FIG. 1. The node 302 may include a pin pad such as pad 304 for facilitating the connection.

The output section 306 provides a signal to the node 302 which is controlled by an output enable signal shown on line 308. In one embodiment of the invention, a low logic level on the output enable signal line 308 causes the I/O device output section 306 to provide a signal to the node 302 which corresponds to a signal on line 310. Other structures can be envisioned, such as a high active output enable signal on line 308, or an inverting output section 306, as long as it maintains the ability to control the output section 306 to provide a known logic level at the node 302 upon actuation of a predetermined output enable signal on line 308.

When the output enable signal on line 308 is at an inactive logic level, the output section 306 enters a high-impedance state, causing the node 302 to maintain its immediately preceding signal logic level due to the logic level maintaining unit 312. This logic level remains at node 302 until overridden by another (e.g., external) signal level applied to the node 302 via the pad 304. For example, where the logic level maintaining unit 312 maintains a logic level at node 302, actuation of a key coupled to a connection terminating at the pad 304 may change the logic level at the node 302. The input section 314 of the key sense circuit 300 provides an input on line 316 corresponding to the logic level at node 302. The key sense circuit 300 therefore allows a logic level to be initially precharged on the pad 304 using the output section 306, and then allows the logic level at the node 302 to be changed externally by providing an external signal to pad 304, which in turn is provided to the loop monitor 234 of FIG. 2 via the signal on line 316. The loop monitor 234 controls the sequence and loop rate by manipulating the output enable signal on line 308.

Figure 4:
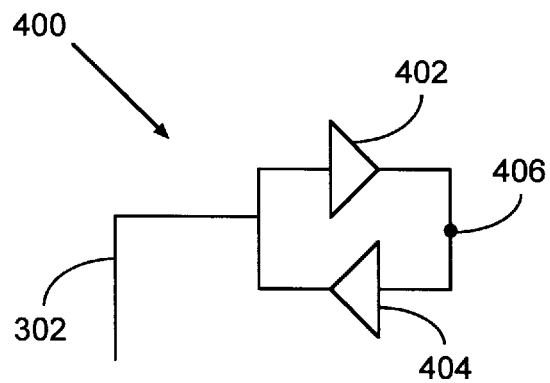
FIG. 4 illustrates one embodiment of a logic level maintaining unit in accordance with one embodiment of the invention.

FIG. 4 illustrates one embodiment of a logic level maintaining unit, shown as repeater 400, in accordance with one embodiment of the invention. A repeater 400 is advantageous in the present invention versus a pull up device in that it can maintain either a logic high or a logic low level, thereby acting as a memory cell. The repeater 400 includes a pair of buffers 402, 404 which can both be inverting buffer devices, or can both be non-inverting buffer devices. For example, buffers 402 and 404 can be inverting buffers where a high logic level at the node 302 is inverted at buffer 402 to provide a low logic level at node 406, which is again inverted by buffer 404 to return to the high logic level at the node 302. Where the output section 306 enters a high-impedance state as described in connection with FIG. 3, the repeater 400 can maintain the logic level originally supplied to the node 302 by the input signal on line 310 of the output section 306.

The repeater 400 is sized appropriately such that it is not unstable to the point that capacitively coupled noise at the node 302 is able to override the logic state stored by the repeater 400. On the other hand, the repeater 400 should be able to be overridden by an external signal provided by the logic level on a connection coupled through a key switch such as key switch 222. For example, where the output section 306 from one key sense circuit can sink more current than buffer 404 from another sense circuit can source, the repeater 400 can be overridden by a key sense circuit output section. Therefore, where an output section from one key sense circuit, such as output section 306 of key sense circuit 226, provides a low logic level to the node 302 of another key sense circuit such as key sense circuit 230, the "weak" high logic level stored at repeater 400 of key sense circuit 230 would be overridden and therefore changed to a low logic level. This new low logic level would in turn be stored by the repeater 400 of key sense circuit 230.

This repeater sizing may depend on the logic technology, which is CMOS technology in one embodiment of the invention. The various technologies include specifications relating to the operating supply voltages and noise immunity versus transient current tradeoff. These characteristics are used in determining the proper sizing of the repeater 400, as can be appreciated by those skilled in the art from the above description.

Figure 5:
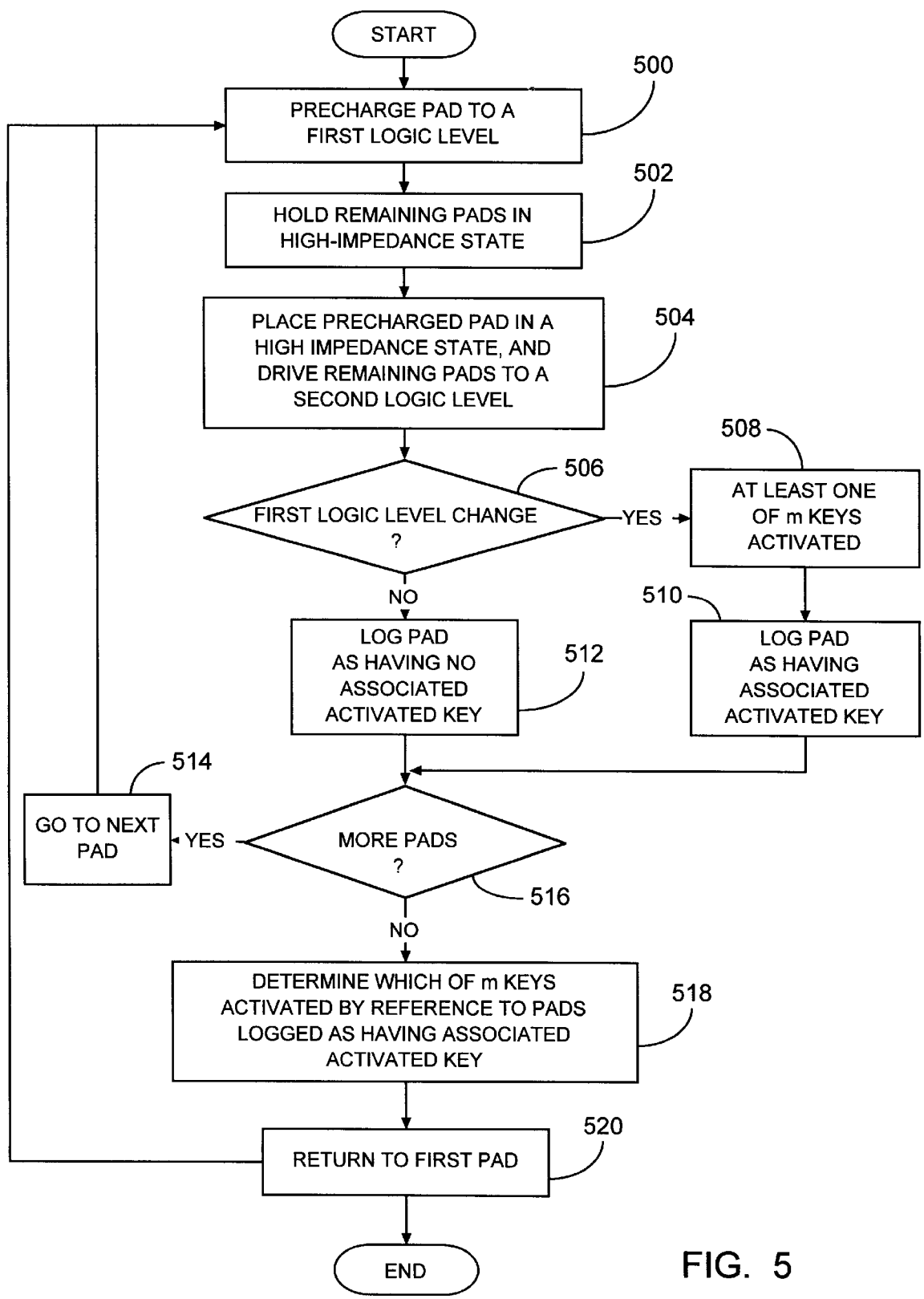
FIG. 5 is a flow diagram illustrating the operation according to one embodiment of the present invention.

FIG. 5 is a flow diagram illustrating the operation of one embodiment of the present invention. Reference will also be made to the devices identified in FIGS. 1–4. The loop monitor 234 of the key scanning controller 104 precharges 500 a first pad of one of the n connections to a first known logic level. In one embodiment of the invention, the first pad is precharged to a high logic level using the key sense circuit corresponding to that connection. The other connections are held 502 in a high impedance state during the precharging 500 of the first pad. The precharged logic level at the pad will be maintained by the associated repeater cell 400 of its corresponding key sense circuit.

When the particular pad has been precharged, it is placed in a high impedance state through the use of the output enable signal on 308, and the remaining pads corresponding to the remaining connections are driven 504 to a second known logic level. In one embodiment of the invention, the second logic level is a low logic level. The loop monitor 234 determines 506 whether the first logic level has changed by reading the corresponding key sense circuit output, shown in FIG. 3 as input line 316. If the first logic level has changed from its precharged value, it indicates that at least one of m keys have been activated 508, which drives the precharged value to the second known logic level. For example, Table 1 illustrates that a low logic level at connector 200 could result from the actuation of any of keys A 210, B 212, or C 214. The value m depends on the number of keys desired for use in the system, and is equal to 3 in the illustrated embodiment of FIG. 2. The key scanning controller 104 identifies or logs 510 the pad corresponding to that connection as having an associated activated key.

Where the key scanning controller 104 does not detect 506 a change in the first logic level, the pad is logged 512 as having no associated activated key. Therefore, where a pad is monitored by the loop monitor 234, it is designated as having, or not having, an associated activated key. The loop monitor 234 continues by monitoring the next pad 514 where it has determined 516 that there are more pads to be monitored. The next pad is then precharged 500 as the first pad was, and the process continues until the logic levels associated with all pads have been identified.

Where all of the pads have been read, it is determined 518 which of the m keys is activated by referencing the pads which have been logged as having an associated activated key. This can be determined in a manner as previously described in connection with Table 2. For example, where connection 202 and connection 206 have been logged as having associated activated keys, the identified key is key E 218. The loop monitor continues to monitor for key activations by returning 520 to the first pad, and repeating the process. The process may continually loop, or may alternatively include a predetermined time delay before returning to the first pad to monitor the connections.

The present invention therefore provides for single-dimension key switch detection, rather than two-dimensional matrix key switch detection. This allows the number of key switch inputs at the key scanning controller (e.g., microprocessing unit) to be reduced, thereby reducing the number of inputs or chip pins required. The pin reduction benefit of the present invention, where the number of connections is taken k=2 at a time, over that of a conventional key matrix configuration is shown in Table 3 below:

TABLE 3

| NUMBER OF PINS | ATTAINABLE NUMBER OF KEYS | |
|---|---|---|
| | MATRIX CONFIG. | PRESENT INVENTION |
| 4 | 4 | 6 |
| 5 | 6 | 10 |
| 6 | 9 | 15 |
| 7 | 12 | 21 |
| 8 | 16 | 28 |
| 9 | 20 | 36 |
| 10 | 25 | 45 |

Other embodiments of the invention will be apparent to those skilled in the art from consideration of the specification and practice of the invention disclosed herein. It is intended that these embodiments be considered as exemplary only, with a true scope and spirit of the invention being indicated by the following claims.

What is claimed is:

1. A one-dimensional key scanning system for use in detecting the activation of keys on a key-based input device, comprising:

a plurality of logic level sensors to detect and temporarily store logic levels on corresponding connection nodes, wherein each of the connection nodes has no inherent association with any other ones of the connection nodes;

a plurality of switches, each coupled to one of the keys and to any predetermined one or more of the connection nodes to provide a unique pattern of logic levels on a totality of the connection nodes in response to the activation of a particular one of the keys, wherein the unique pattern of logic levels collectively provides an indication of which of the keys has been activated.

2. The key scanning system as in claim 1, wherein a number of possible combinations of the patterns of logic levels is determined by $$\frac{n!}{k!(n-k)!}$$

where n is a total number of the connection nodes, and k is a number of the connection nodes driven to the known logic level in response to the activation of the particular one of the keys.

3. The key scanning system as in claim 1, wherein any combination of the connection nodes is available to represent one of the unique patterns of logic levels.

4. The key scanning system as in claim 1, wherein the logic level sensors comprise:

a controllable driver to precharge the corresponding connection node to a precharge level; and a logic level maintaining circuit to maintain the precharge level on the connection node, and to store the known logic level driven onto the corresponding connection nodes by a corresponding one of the switches.

5. The key scanning system as in claim 4, wherein the controllable driver comprises a tri-state driver having an output enable terminal to receive an output control signal.

6. The key scanning system as in claim 1, each of the plurality of switches comprises two switch terminals, each of the switch terminals being coupled to one of the connection nodes such that the activation of the particular one of the keys provides a common logic level on the connection nodes coupled to the two switch terminals.

7. The key scanning system as in claim 6, wherein a first logic level on a first one of the connection nodes is overridden by a second logic level on a second one of the connection nodes to produce the common logic level on the first and second connection nodes coupled to the two switch terminals.

8. The key scanning system as in claim 1, further comprising a logic monitor coupled to the plurality of logic level sensors to detect the stored logic levels and recognize the activation of the particular one of the keys based on the pattern of the stored logic levels.

9. The key scanning system as in claim 8, wherein the logic monitor comprises:

a loop monitor coupled to the plurality of logic level sensors to detect the stored logic levels; and a comparator coupled to the loop monitor to compare the pattern of stored logic levels to known binary patterns corresponding to the activation of the keys.

10. The key scanning system as in claim 8, wherein the logic monitor comprises a computing device configured and arranged to periodically read the stored logic levels and compare the pattern of the stored logic levels to a table of known patterns, and to recognize the activated one of the keys in response to a match of one of the patterns of the stored logic levels to one of the known patterns.

11. The key scanning system as in claim 8, wherein the logic monitor comprises an enable circuit to periodically provide an enable signal to each of the plurality of logic level sensors, and to periodically read the stored logic levels and compare the pattern of the stored logic levels to a table of known patterns, wherein each of the known patterns corresponds to activation of one of the keys.

12. The key scanning system as in claim 8, wherein the logic level sensors each comprise a logic level maintaining circuit to store the logic levels driven onto the corresponding connection nodes by a corresponding one of the switches.

13. The key scanning system as in claim 12, wherein the logic level maintaining circuit comprises a repeater cell comprising a pair of buffers coupled to each other to form a memory cell.

14. The key scanning system as in claim 13, wherein the pair of buffers is selected from a group comprising a pair of non-inverting buffers and a pair of inverting buffers.

15. A method for detecting the actuation of switches in a key-based input device, comprising:

imparting a unique pattern of logic levels onto an aggregation of nodes upon the actuation of a particular one of the switches, wherein any combination of logic levels on the aggregation of nodes is available to represent one of the unique patterns of logic levels;

temporarily storing the unique pattern of logic levels;

monitoring the aggregation of nodes; and comparing the stored logic levels to a plurality of known binary patterns to determine which of the switches has been actuated by matching the patterns of stored logic levels to one of the known binary patterns.

16. The method of claim 15, wherein temporarily storing the unique pattern of logic levels comprises providing each of the logic levels to a different repeater including a pair of buffers coupled to each other to form a memory cell.

17. The method of claim 15, wherein monitoring the aggregation of nodes comprises:

(a) precharging one of the nodes to a first logic level;

(b) driving a remaining portion of the nodes to a second logic level;

(c) determining whether the one of the nodes has changed from the first logic level to the second logic level;

(d) storing an actuation indication corresponding to the one of the nodes where it has changed from the first logic level to the second logic level;

(e) continuing (a) through (d) until each of the nodes has been monitored; and (f) comparing a pattern of the actuation indications to known patterns, wherein each of the known patterns corresponds to the actuation of a different one of the switches.

18. The method of claim 17, wherein precharging one of the nodes to a first logic level comprises driving and maintaining a known logic level to the one of the nodes.

19. The method of claim 17, further comprising repeating (a) through (f) at predetermined time intervals.

20. The method of claim 15, wherein imparting a unique pattern comprises driving known logic levels onto predetermined combinations of the nodes upon the actuation of different ones of the switches.

21. The method of claim 20, wherein driving known logic levels onto predetermined combinations of the nodes comprises:

driving and storing a first logic level onto a first node;

driving and storing a second logic level onto remaining ones of the nodes;

replacing the first logic level on the first node with the second logic level from the remaining one of the nodes which is upon activation of a particular one of the switches, wherein the nodes are thereby imparted with one of the unique patterns of logic levels.

22. The method of claim 21, wherein the first logic level is a high logic level and the second logic level is a low logic level, wherein replacing the first logic level comprises overriding the high logic level with the low logic level by electrically shorting the second node to the first node.

23. The method of claim 22, further comprising sinking the current generated at the first node with circuitry at the second node.

24. For use with a keyboard control circuit in which at least one of N keys is activated, a one-dimensional activated-key detecting arrangement, comprising:

Y send-return lines, each of the N keys assigned to at least two of the send-return lines to impart a unique combination of logic levels onto the Y send-return lines, wherein any combination of the logic levels on the Y send-return lines is available to represent one of the unique combinations of logic levels;

a set of Y level-maintaining circuits, each of the level-maintaining circuits assigned and coupled to a send-return line and arranged to maintain the logic level on the assigned send-return line;

a set of N switches, each of the N switches coupled to at least two send-return lines in a non-matrixed configuration; and a control circuit, coupled to the Y send-return lines to identify the unique combination of the logic levels on the Y send-return lines for each of the N keys activated, wherein the control circuit is configured and arranged to:

drive a first logic level onto one of the Y send-return lines;

drive a second logic level onto the remaining (Y−1) of the Y send-return lines;

detect a logic state imparted on the one of the Y send-return lines by driving the second logic level from one of the remaining (Y−1) send-return lines onto the one Y send-return line when any of the N keys corresponding to the remaining (Y−1) send-return lines has been activated;

repeat the first logic level driving, maintaining, second logic level driving, and detecting steps, driving the first logic level on a different one of the Y send-return lines during each iteration; and determine which of the N keys has or have been activated as a function of the detected logic states and of a table mapping the detected logic states to one or more keys.

25. For use in connection with a keyboard control circuit in which at least one of N keys is activated, an activated-key detecting method, comprising:

driving a unique combination of logic levels onto an aggregate set of send-return lines for each of the N keys activated, wherein any combination of the logic levels on the set of send-return lines is available to represent one of the unique combinations of logic levels, and wherein each of the N keys is assigned and coupled to at least two of the send-return lines to provide the unique combination of logic levels on the aggregate set of send-return lines;

storing a first logic level on one of the send-return lines;

maintaining the first logic level on the one of the send-return lines;

storing a second logic level on a remaining portion of the send-return lines;

detecting a logic state stored by the one of the send-return lines by imparting the second logic level from one of the remaining portion of send-return lines to the one of the send-return lines when any of the N keys corresponding to the remaining portion of the send-return lines has been activated;

repeating the first logic level storing, maintaining, second logic level storing, and detecting steps, storing the first logic level on a different one of the send-return lines during each iteration; and determining which of the N keys has been activated as a function of the detected logic states and of a table mapping the detected logic states to one or more of the N keys.

26. A one-dimensional key scanning system for use in detecting the activation of keys on a key-based input device, comprising:

means for collectively imparting a unique pattern of logic levels onto all of a plurality of nodes upon the actuation of one of the keys, wherein any combination of a total number of the nodes is available to represent one means for temporarily maintaining the unique pattern of logic levels upon actuation of the actuated key;

means for monitoring all of the plurality of nodes to determine the unique pattern of logic levels resulting from the actuated key; and means for comparing the unique pattern of logic levels to predetermined logic patterns to identify which of the keys has been actuated by matching the unique pattern of logic levels to one of the predetermined logic patterns.

\* \* \* \* \*